US006795942B1

(12) United States Patent
Schwarz

(10) Patent No.: US 6,795,942 B1
(45) Date of Patent: Sep. 21, 2004

(54) BUILT-IN REDUNDANCY ANALYSIS FOR MEMORIES WITH ROW AND COLUMN REPAIR

(75) Inventor: William D. Schwarz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 640 days.

(21) Appl. No.: 09/611,524

(22) Filed: Jul. 6, 2000

(51) Int. Cl.[7] .............................................. G11C 29/00
(52) U.S. Cl. ..................... 714/718; 714/711; 714/733; 714/741
(58) Field of Search ................................ 714/718, 733, 714/741, 710–711

(56) References Cited

U.S. PATENT DOCUMENTS

| | | | | | |
|---|---|---|---|---|---|
| 4,456,995 A | * | 6/1984 | Ryan | ........................... | 714/723 |
| 4,833,652 A | * | 5/1989 | Isobe et al. | ................... | 365/201 |
| 5,337,318 A | * | 8/1994 | Tsukakoshi et al. | ......... | 714/708 |
| 5,371,748 A | * | 12/1994 | Saw et al. | ................... | 714/718 |
| 5,754,556 A | * | 5/1998 | Ramseyer et al. | ........... | 714/711 |
| 5,795,797 A | * | 8/1998 | Chester et al. | ............... | 714/711 |
| 5,841,783 A | * | 11/1998 | Suzuki et al. | ................ | 714/718 |
| 5,954,828 A | * | 9/1999 | Lin | ............................. | 714/718 |
| 5,983,374 A | * | 11/1999 | Todome et al. | .............. | 714/718 |
| 6,011,734 A | * | 1/2000 | Pappert | ....................... | 714/711 |
| 6,032,264 A | * | 2/2000 | Beffa et al. | ...................... | 714/7 |
| 6,317,846 B1 | * | 11/2001 | Higgins et al. | .............. | 714/718 |
| 6,535,993 B1 | * | 3/2003 | Hamada et al. | .............. | 714/718 |
| 6,539,506 B1 | * | 3/2003 | Lammers et al. | ............ | 714/711 |

OTHER PUBLICATIONS

Bhavsar, "An Algorithm for row–column self–repair of RAMS and its implementation in the alpha 21264" Sep. 1999, International test conference 1999, pp 311–318.*
Mookerjee, R., Segmentation: a technique for adapting high–performance logic ATE to test high–density, high–-speed SRAMs, Aug. 9–10, 1993, Records of the 1993 IEEE International Workshop on Memory Testing, pp. 122–124.*

* cited by examiner

Primary Examiner—Guy J. Lamarre
(74) Attorney, Agent, or Firm—Conley Rose, P.C.

(57) ABSTRACT

A method is presented for built-in redundancy analysis of a semiconductor memory device. The method does not require retention of an entire memory bitmap, and may be implemented on-chip and integrated within existing BIST circuitry. The regular memory is comprehensively tested, and defective rows and columns are flagged for replacement by redundant rows and/or columns; the elements containing the most defects are the first to be flagged. If all of the defective memory locations can be replaced using redundant rows and columns, the method designates the memory as repairable; a repair solution may then be scanned out of the memory device. The method is believed to provide a fast, cost-effective means of testing and repairing memory devices, with a consequent improvement in production yields.

30 Claims, 7 Drawing Sheets

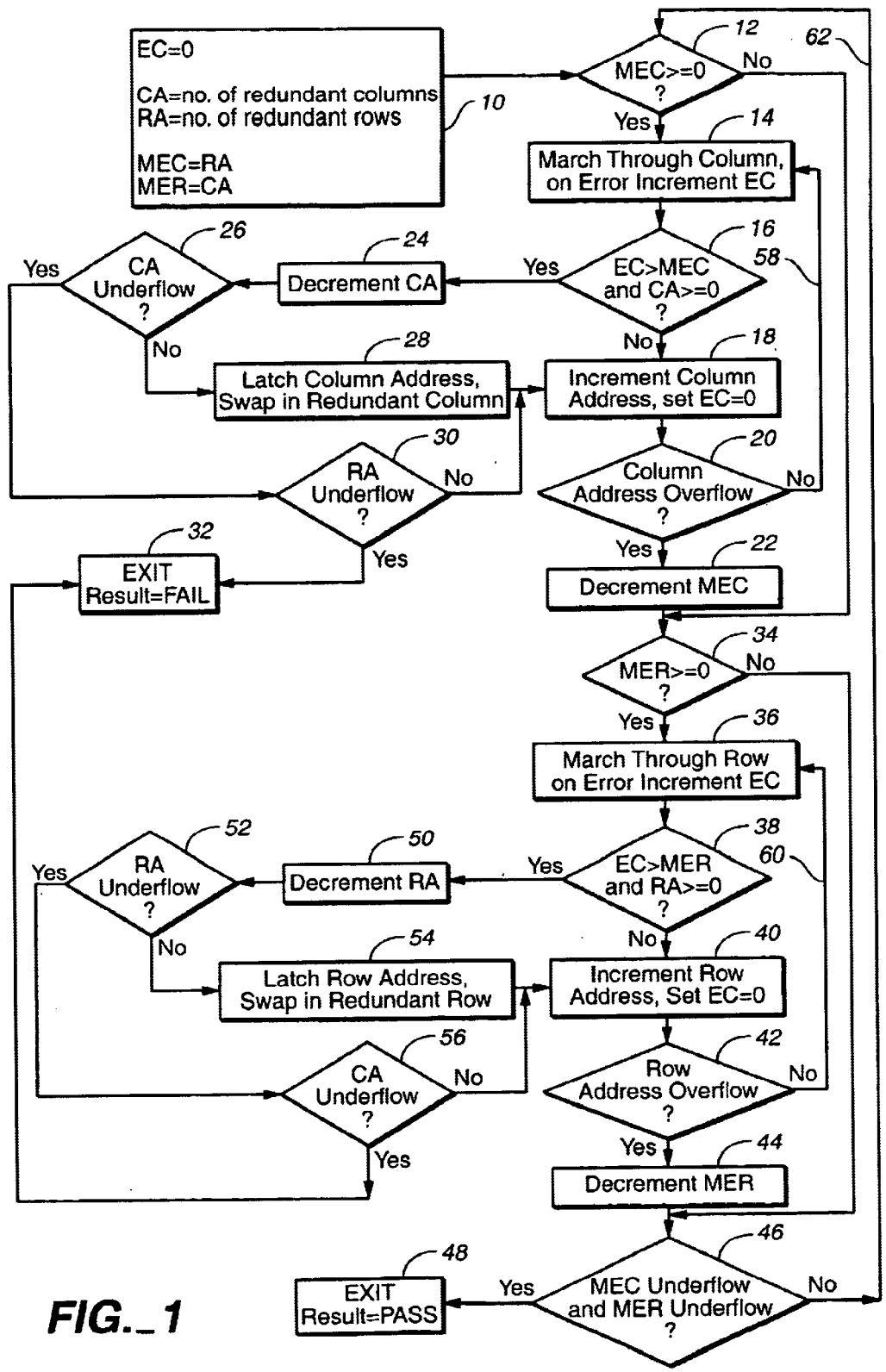
FIG._1

Repairable Bitmaps Found By Memory Tester

Number of Redundant Columns

|   | 0 | 1 | 2 | 3 | 4 | 5 | 6 | 7 | 8 |
|---|---|---|---|---|---|---|---|---|---|
| 0 | 0 | 6323 | 8981 | 10179 | 10916 | 11412 | 11813 | 12135 | 12552 |
| 1 | 5341 | 8951 | 10565 | 11392 | 11927 | 12353 | 12690 | 12959 | 13390 |
| 2 | 7466 | 10136 | 11459 | 12173 | 12645 | 13015 | 13332 | 13584 | 14031 |
| 3 | 8196 | 10686 | 11928 | 12564 | 13024 | 13361 | 13643 | 13891 | 14296 |
| 4 | 8672 | 11079 | 12260 | 12879 | 13317 | 13629 | 13907 | 14130 | 14551 |
| 5 | 8926 | 11317 | 12499 | 13098 | 13518 | 13839 | 14082 | 14297 | 14707 |
| 6 | 9202 | 11576 | 12743 | 13337 | 13720 | 14000 | 14240 | 14440 | 14831 |
| 7 | 9360 | 11734 | 12914 | 13504 | 13852 | 14137 | 14358 | 14540 | 14945 |
| 8 | 9525 | 11907 | 13084 | 13631 | 13986 | 14257 | 14478 | 14660 | 15061 |

Number of Redundant Rows (row labels on left)

*FIG._2A*

Repairable Bitmaps Found By BIRA Method

Number of Redundant Columns

|   | 0 | 1 | 2 | 3 | 4 | 5 | 6 | 7 | 8 |
|---|---|---|---|---|---|---|---|---|---|
| 0 | 0 | 6323 | 8981 | 10179 | 10916 | 11412 | 11813 | 12135 | 12552 |
| 1 | 5341 | 8951 | 10516 | 11319 | 11864 | 12284 | 12651 | 12910 | 13327 |
| 2 | 7466 | 10136 | 11450 | 12109 | 12593 | 12968 | 13272 | 13523 | 13957 |
| 3 | 8196 | 10648 | 11924 | 12559 | 12989 | 13306 | 13585 | 13829 | 14241 |
| 4 | 8672 | 11044 | 12211 | 12872 | 13308 | 13596 | 13849 | 14070 | 14494 |
| 5 | 8926 | 11280 | 12447 | 13061 | 13511 | 13829 | 14046 | 14253 | 14650 |
| 6 | 9202 | 11527 | 12697 | 13290 | 13685 | 13990 | 14229 | 14398 | 14788 |
| 7 | 9360 | 11701 | 12861 | 13462 | 13813 | 14092 | 14356 | 14531 | 14908 |
| 8 | 9525 | 11863 | 13041 | 13581 | 13957 | 14211 | 14442 | 14658 | 15051 |

Number of Redundant Rows (row labels on left)

*FIG._2B*

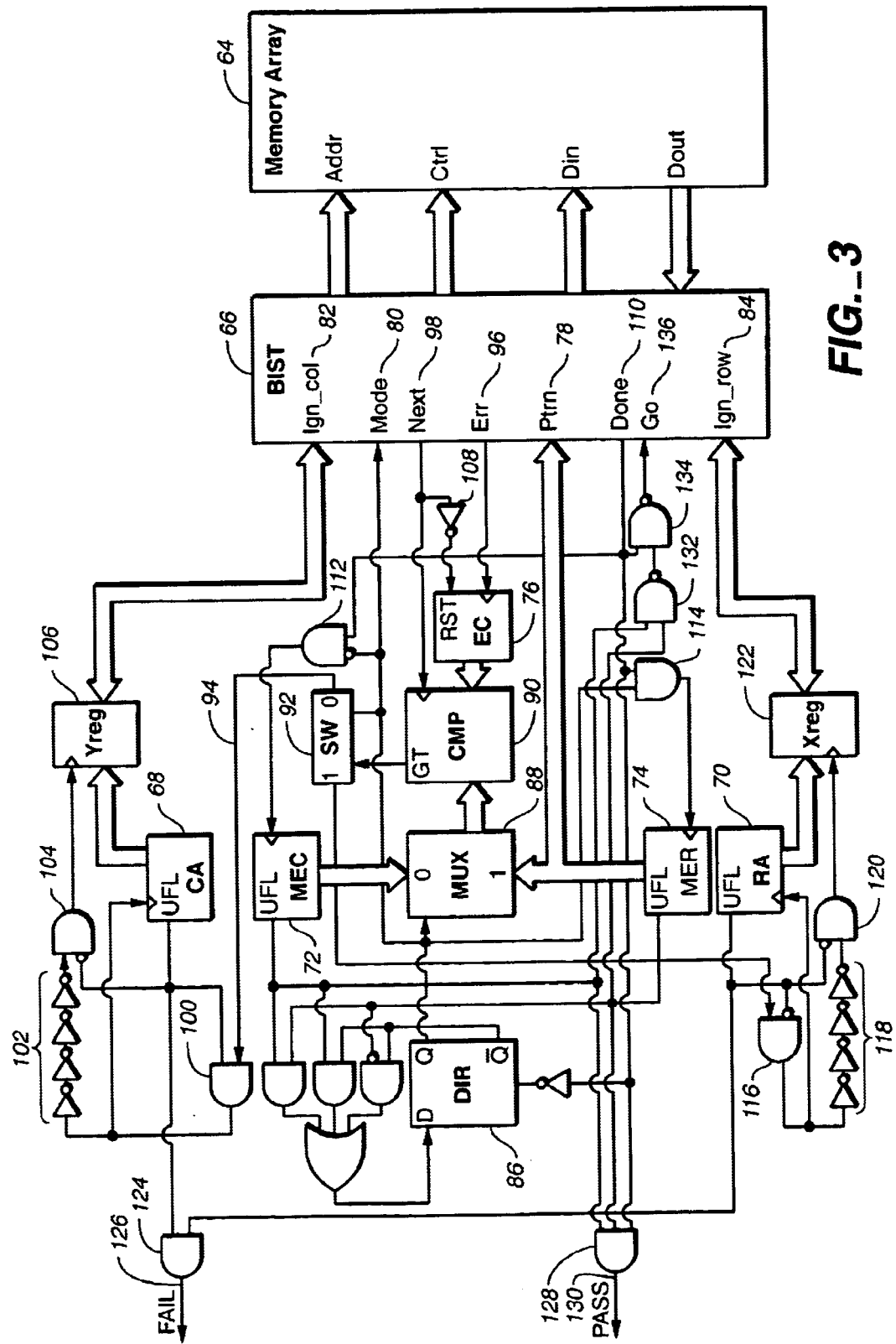
FIG._3

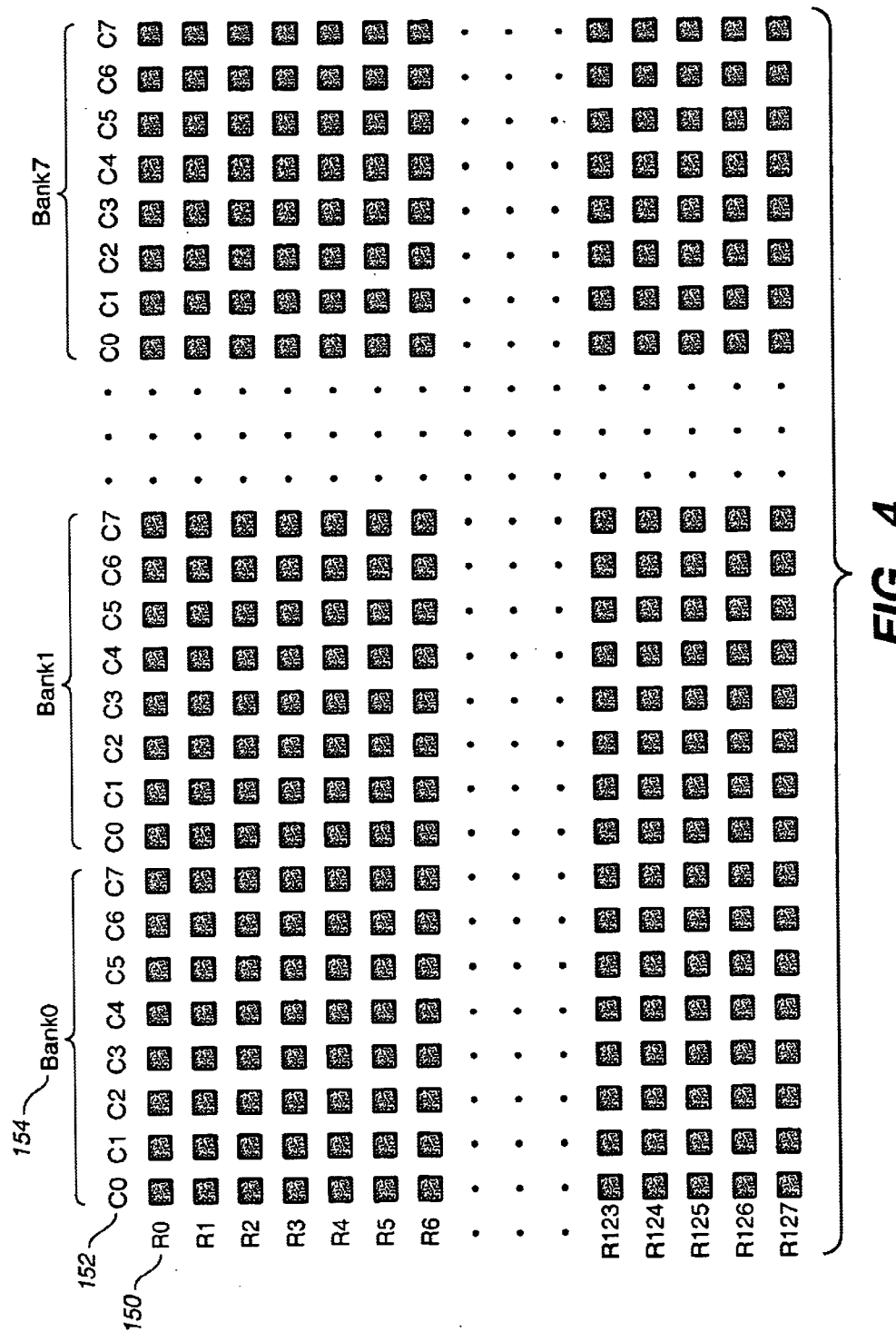
FIG._4

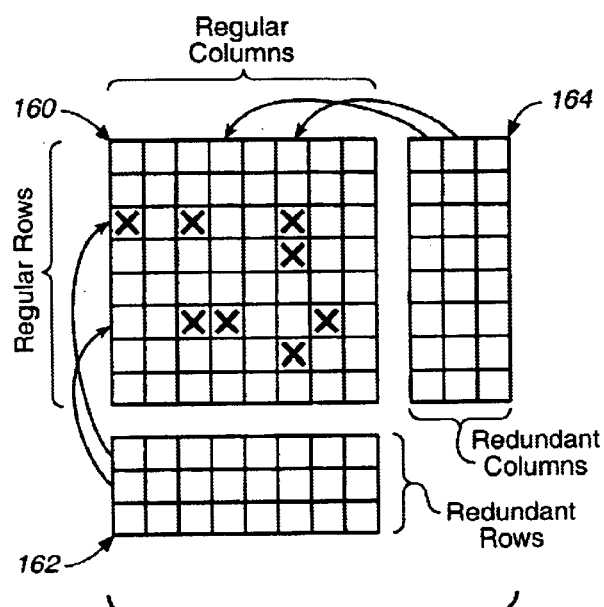
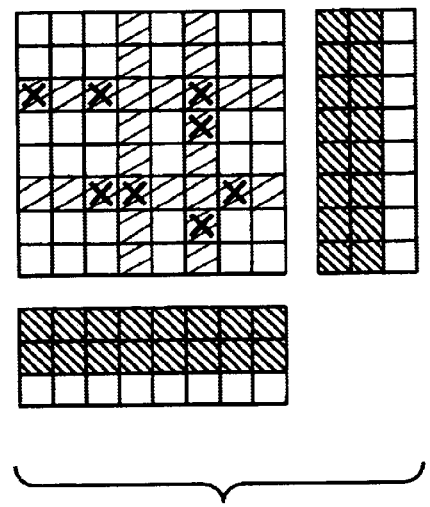
FIG._5A     FIG._5B
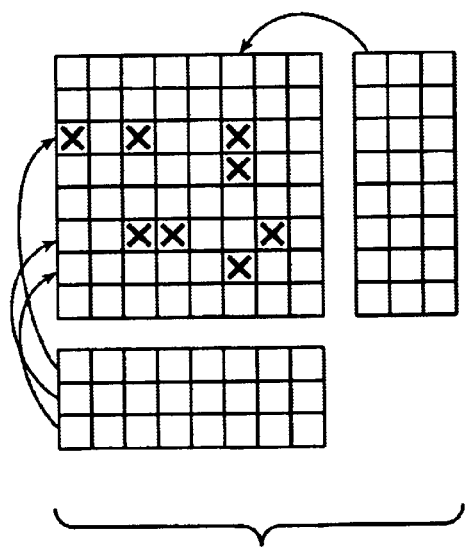
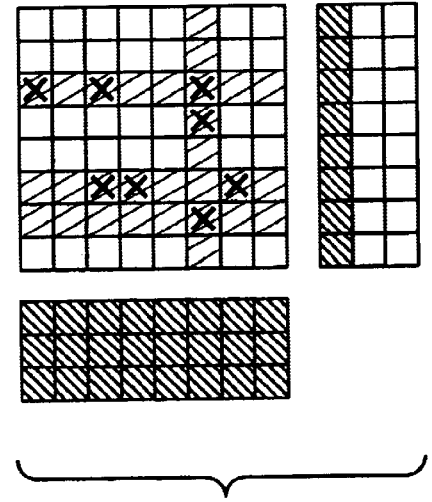
FIG._5C     FIG._5D

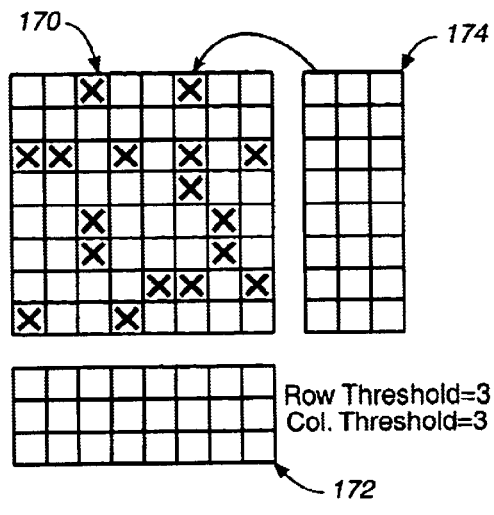
*FIG._6A*
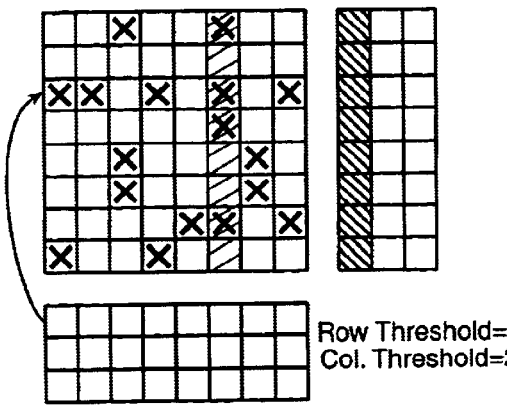
*FIG._6B*
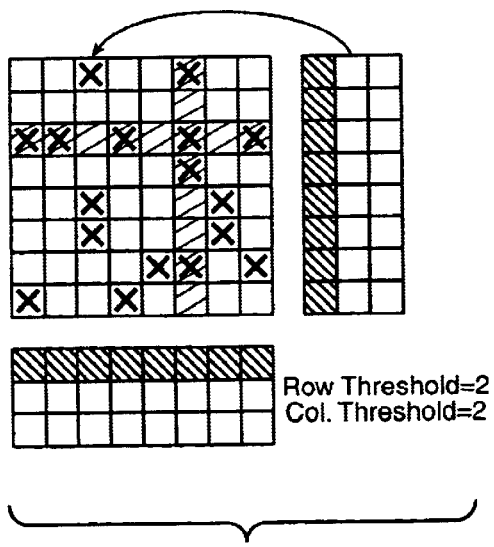
*FIG._6C*
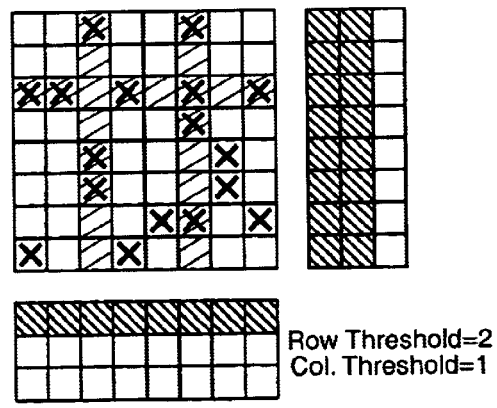
*FIG._6D*

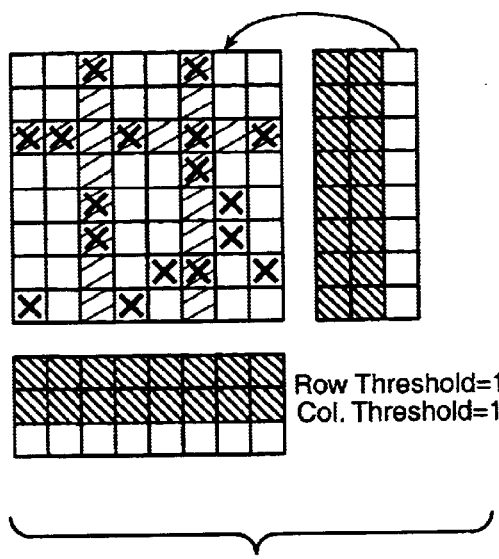
FIG._6E
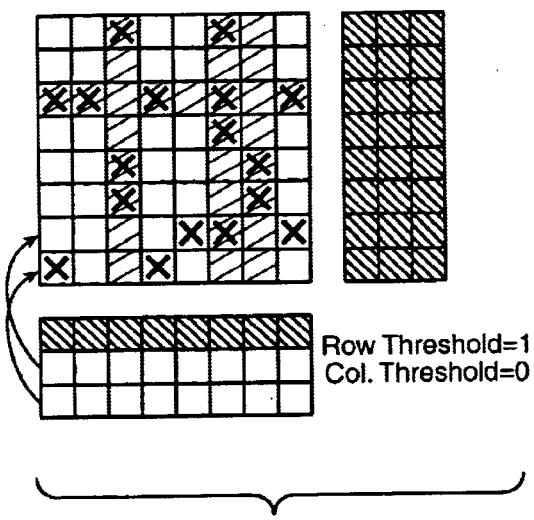
FIG._6F
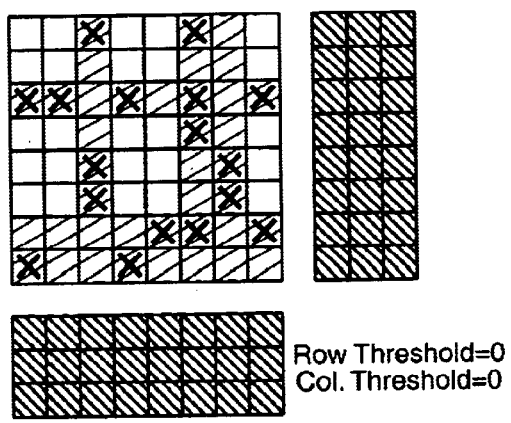
FIG._6G
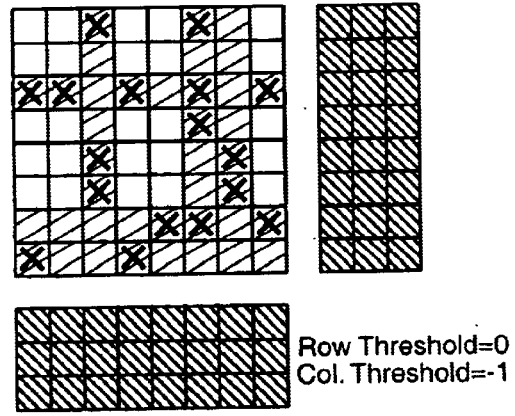
FIG._6H

BUILT-IN REDUNDANCY ANALYSIS FOR MEMORIES WITH ROW AND COLUMN REPAIR

BACKGROUND OF THE INVENTION

1. Field of Invention

This invention relates to semiconductor memory and, more particularly, to the testing and repairing of semiconductor memory.

2. Description of Related Art

Semiconductor memory is a crucial resource in modern computers, being used for data storage and program execution. With the exception of the central processor itself, no other component within the computer experiences as high a level of activity. Traditional trends in memory technology are toward greater density (more memory locations, or "cells", per part), higher speed and improved reliability. To some extent, these goals are inconsistent. For example, as memory density increases, the incidence of defects also rises. As a result, production yields of high-density memory devices with zero defects would be so low as to render them prohibitively costly. However, an alternative to building perfect devices is to build spare memory cells into the devices. After the memory is tested to locate any faults, any bad cells that were detected are replaced from among the spares. As long as there are sufficiently many working cells to replace the defective ones, a fully functional memory device can be made. Functional cells may be substituted for defective ones using a laser to restructure the interconnections within the memory device. Alternatively, the use of internal circuitry for self-test and self-repair is increasingly common in large memory devices. The techniques for internally detecting faulty memory cells and for replacing them with working cells are commonly referred to as built-in self-test (hereinafter, "BIST") and built-in self-repair (hereinafter, "BISR"), respectively. BIST and BISR are instrumental in obtaining acceptable yields in the manufacture of high-performance semiconductor memory.

A typical memory device, as considered herein, is organized as m rows×n columns of regular (i.e., addressable) memory, along with p redundant rows (in which each row is n columns wide) and q redundant columns (in which each column is m rows deep). The use of redundant memory locations, together with on-chip circuitry for testing memory cells permits built-in self-test (BIST) of memory devices. Some memory devices also include built-in self-repair (BISR) circuitry, for reconfiguring internal connections. This allows redundant rows or columns to be substituted for defective regular rows or columns.

A memory test typically consists of writing a pattern to specific memory locations and then verifying that the written values were actually stored in those locations. If a particular cell is defective it will appear as a discrepancy in the pattern when it is read back. For example, a cell that cannot be written to will in effect be "stuck" at either a 1 or 0, and an attempt to write the opposite value to that cell will fail and show up as an anomaly upon reading back the memory. Other failure modes may also occur, such as coupling errors, in which the logic state of a cell changes due to a change in an adjacent cell. A march technique is commonly used in testing memory. This technique involves first writing a test pattern to the memory, then starting at the top of the memory and marching through the addresses, reading the contents of each location, writing the opposite value, then moving on to the next address. A march can be rowfast or columnfast. A rowfast march takes one column and marches through it one row at a time, and a columnfast march does exactly the opposite.

BIST routines may perform effective self-test of the memory device, but do not prescribe a procedure for repair. The repair strategy requires determining how to allocate the available redundant rows and columns so that all defective cells are replaced. The larger the memory, the more formidable this task becomes.

The problem of optimizing the utilization of redundant rows and columns to repair the memory faults is known as "redundancy analysis". Redundancy analysis of large memories is mathematically complex. Conventionally, an analysis of the entire addressable memory is performed by a dedicated memory tester, which utilizes complex mathematical algorithms to arrive at the optimal allocation of redundant rows and columns to repair all the defects. There are significant disadvantages associated with these testers. In the first place, they may be expensive. Since it is necessary to completely map the memory device and record the location of each defective cell before the tester can execute its repair algorithm, a substantial amount of memory is required within the tester itself. Moreover, the computationally intensive algorithm required for true optimal allocation of redundant rows and columns demands a substantial degree of processing power.

A further disadvantage to the use of conventional external memory testers is that the memory under test often may be embedded within another device (i.e., as on-chip memory), such as a microcontroller. In this case, the memory tester may not be capable of probing the memory directly. Then, the BIST feature of the memory is called upon to provide a bitmap to the tester by serially transmitting the information out through a single device pin. For large memory devices, this can clearly be a time-consuming process.

In view of the above-mentioned problems, it would be beneficial to have a more complete and robust method for self-test and self-repair of semiconductor memory devices.

SUMMARY OF THE INVENTION

The problems outlined above are in large part solved by a built-in redundancy analysis (hereinafter, BIRA) method suitable for inclusion in memory devices having built-in self-test (BIST) capability. It is assumed that the memory is organized as a matrix of rows and columns, comprising a regular portion and a redundant portion. It is further assumed that rows and columns from the redundant portion can be used to replace defective rows and columns in the regular portion. The method applies a multi-pass evaluation of the regular memory elements, where "element" refers to a row or column. In each pass, it records the number and location of defects in every regular element. If the number of defects in any element exceeds a threshold value, that element is flagged for replacement by one of the redundant elements. At this point, if the number of redundant elements available is greater than a predetermined acceptable value (preferably, zero), the number of available redundant elements is decremented and the process continues; however, if there are no remaining redundant elements to be used as replacements, the process terminates and the memory is designated non-repairable. At the conclusion of each pass through the memory the threshold value is decremented. If the threshold reaches zero, the process terminates and the memory is designated repairable; otherwise, the next pass begins. By lowering the threshold value with each pass, the criterion for replacement of defective memory elements becomes more and more stringent. This ensures that regular elements with the most defects are the first to be replaced, and is believed to lead to an efficient allocation of the redundant elements.

In a preferred embodiment, the regular memory elements comprise rows or columns of regular memory, and the redundant elements comprise redundant rows or columns. In a preferred embodiment, the present method employs both rowfast and columnfast marches, and uses a variety of test patterns. Alternate passes through memory perform columnwise, then row-wise evaluation, using one or more test patterns, which may vary. Following a successful test outcome, the addresses of rows and columns that need to be replaced can be scanned out of the memory, for use in laser repair; this takes far less time than scanning out a complete memory bitmap. Alternatively, if the memory device is capable of self-repair, redundant rows and columns can be swapped in automatically.

A system implementing the above-described BIRA method is also contemplated herein. In a preferred embodiment, the system may be comprised of standard logic gates and integrated within the BIST circuitry of the memory device. In another embodiment, the BIST and BIRA circuitry are both controlled by an execution unit, such as a state machine, adapted to carry out the method described herein. The execution unit may be configured using a hardware description language.

A computer-usable carrier medium having program instructions executable to implement the above-described BIRA method is also contemplated herein. The carrier medium may be a storage medium, such as a magnetic or optical disk, a magnetic tape, or a memory. In addition, the carrier medium may be a wire, cable, or wireless medium along which the program instructions are transmitted, or a signal carrying the program instructions along such a wire, cable or wireless medium. In an embodiment, the carrier medium may contain program instructions in a hardware description language, such as Verilog, to configure circuitry within the memory device capable of implementing the BIRA routine.

The performance of the BIRA method described herein is comparable to that of a dedicated memory tester. The memory tester, using a sophisticated mathematical algorithm, arrives at an optimal allocation of redundant memory elements to replace defective regular elements for every possible distribution of defects. However, in comparisons using bitmaps to represent distributions of defective cells in a memory device of a given size, the number of bitmaps found to be repairable by the BIRA method is nearly equal to that found by the memory tester. The BIRA method is believed to be much less computationally demanding than algorithms employed by dedicated memory testers, which typically must examine the entire memory bitmap. Furthermore, since BIRA capability can be incorporated into on-chip circuitry adjacent to the memory device itself, redundancy analysis may be performed significantly faster than by a stand-alone tester. Thus, the BIRA method and system described herein are believed to represent an alternative to the use of an offline tester for redundancy analysis, and thereby constitute a cost-effective means of improving memory device yields.

BRIEF DESCRIPTION OF THE DRAWINGS

Other objects and advantages of the invention will become apparent upon reading the following detailed description and upon reference to the accompanying drawings in which:

FIG. 1 is a flowchart of a preferred embodiment of the BIRA routine;

FIGS. 2a and 2b show a comparison between the number of bitmaps found to be repairable by the BIRA method and those found by a dedicated memory tester;

FIG. 3 illustrates an embodiment of electronic circuitry that implements the BIRA method;

FIG. 4 illustrates the organization of a multi-bit memory device;

FIG. 5 illustrates alternative repair strategies for a defective memory device; and FIG. 6 illustrates the operation of the present BIRA method in the repair of a memory device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 5 illustrates how redundant elements may be used to replace defective regular elements in a semiconductor memory device. In FIG. 5a the matrix 160 of regular rows and columns contains several defects, shown as X's. Along with these regular memory elements are redundant rows 162 and columns 164. By reconfiguring interconnection paths within the device, it is possible to substitute redundant rows and columns for their defective counterparts in the regular memory matrix. In practice, this may be done through the use of a laser, or by means of reconfigurable interconnect circuitry within the device itself, the latter capability is known as built-in self-repair (BISR). In general, there are several possible assignments of available redundant rows and columns to repair a given distribution of defects. The object of redundancy analysis is to find an assignment of the redundant elements that repairs all of the defects.

Consider the example shown in FIG. 5a. One possible repair solution, given the availability of three redundant rows and three redundant columns, is to use one redundant row to replace the defective third row of regular memory, and a second to replace the sixth row, and then to use one redundant column to replace the defective fourth regular column, and a second to replace the sixth. FIG. 5b shows the repaired memory, and the remaining redundant row and column. In FIG. 5b, rows and columns that have been replaced are shown with a crosshatch pattern, repaired defects are represented as a dashed X, and redundant rows and columns that have been allocated for repair are shown with a double crosshatch pattern. FIG. 5c illustrates an alternative assignment of redundant elements to repair the same defects. In this case, all three of the redundant rows are used to replace the third, sixth and seventh rows of regular memory, and a single redundant column replaces sixth regular column. FIG. 5d shows that all of the defective cells have been replaced, and that there are no remaining redundant rows and two remaining redundant columns. This simple example illustrates that there can be multiple ways to allocate redundant elements. Of course, in an actual memory device the number of regular rows and columns, as well as the number of defects, is usually much greater. The redundancy analysis is then substantially more complex, often demanding the use of dedicated memory testers. As already mentioned, there are problems associated with the use of such testers.

The BIRA method described herein is believed to alleviate some of these problems by applying a multi-pass evaluation of the regular memory. In each pass, the method tests the entire regular memory either column-by-column, or row-by-row. For simplicity, first consider just the column-wise testing. During a column-by-column pass, the number of defective cells in each column of regular memory is compared against a defect threshold. If the number of defects exceed the threshold, that column is flagged for replacement by a redundant column, and the number of available redundant columns is decremented (e.g., reduced by one). Once a column is flagged for replacement, it is excluded from further testing (since it is considered to be removed from the memory). The column-by-column pass ends when the last column of regular memory has been tested. At this point, the threshold is decremented and the next pass begins. Note that in this process, columns with the greatest number of defects are the first to be replaced. Also note that the process terminates when there are no more redundant columns left to repair remaining defects ("fail"), or when the defect threshold decrements all the way to zero ("pass").

In a preferred embodiment of the BIRA method, column-by-column and row-by-row passes alternate, and there is a separate defect threshold for columns and for rows. FIG. 6 illustrates the method with a simple example. As shown in FIG. 6a, regular memory 170 consists of rows and columns, some of which contain defective cells. Three redundant rows 172 and three redundant columns 174 are available for replacement of defective regular rows and columns. The first pass through the memory is column-by-column in this example (although the method could as easily start with a row-by-row pass), and the row and column defect thresholds are initially set at three. The initial value of the column defect threshold in this embodiment is determined by the fact that there are three redundant rows available. With three redundant rows, it is impossible to repair any column having more than three defects by substitution of redundant rows—therefore, the entire defective column must be replaced by a redundant column. For similar reason, the row defect threshold is initially set to the number of redundant columns. Although there is nothing to be gained by setting the row (or column) defect threshold to a value higher than the number of redundant columns (or rows), the defect thresholds may in some embodiments be set to a lower number.

The first column-by-column pass begins counting defects in each of the columns in regular memory 170, starting with the leftmost column. The sixth column is the first (and only) column found with more than three defects, so it is flagged for replacement by the next available redundant column (as indicated by the arrow in FIG. 6a). The situation at the end of the first column-by-column pass is represented in FIG. 6b. Note that since the sixth column will be replaced, it is no longer included in subsequent testing (indicated by the hatch pattern); also, the redundant column allocated for the replacement is no longer available (indicated by the double crosshatch pattern). The column defect threshold is decremented to two, and the first row-by-row pass is made through regular memory 170. Defects are counted in all the rows, starting with the topmost row. Since the third row is the only row with more than three defects, it is flagged for replacement by the first available redundant row (as indicated by the arrow in FIG. 6b). The situation at the end of the first row-by-row pass is represented in FIG. 6c; it shows that the third row will be ignored in subsequent row-by-row testing, and that one of the available redundant rows has been allocated. The row defect threshold is now decremented to two, and the second column-by-column pass is made. This time, the third column is flagged for replacement, since it has more than two defects; note that the sixth column has more defects, but it has already been flagged, so it is ignored. The second redundant column is allocated to replace the defective third column (as indicated by the arrow in FIG. 6c) and the column defect threshold is decremented to one, then the second row-by-row pass is begun.

FIG. 6d shows the state of affairs during the second row-by-row pass. Observe that the third row is ignored in this pass, since it was previously flagged for replacement, and none of the other rows contain more than two defects (since defects in flagged rows and columns are not counted). Therefore, no rows are flagged for replacement in this pass. At the end of the second row-by-row pass, the row defect threshold is reduced to one and the third column-by-column pass is started, as shown in FIG. 6e. Once again, with a column defect threshold of one, it would seem that the third, fourth, sixth and eighth columns would all qualify for replacement. But, these columns all contain defects that are in rows or columns that have been marked for replacement; hence, they are not counted during this pass. Therefore, only the seventh column has more than one countable defect, and it is flagged for replacement (as indicated by the arrow in FIG. 6e). At the end of the third column-by-column pass the column defect threshold is decremented to zero, the third row-by-row pass begins, and the situation is as shown in FIG. 6f. In this pass, both the seventh and the eighth rows contain more than one countable defect. Thus, both of these rows are flagged for replacement, using the two remaining redundant rows (as indicated by the arrows in FIG. 6f).

At the end of the third row-by-row pass, the row defect threshold is decremented to zero and the fourth column-by-column pass begins, as shown in FIG. 6g. At this point, both the row defect threshold and the column defect threshold are zero, which implies that a row or column with even a single defect would be flagged for replacement. This would be a problem, since we have used up all the redundant rows and columns. Allocation of all the available redundant memory elements is a precondition for failure of the memory. If a row or column is flagged for replacement, but there are no available redundant rows or columns with which to replace it, the memory is deemed unrepairable, and the routine terminates with a "fail" result. Conveniently for this example, there are no remaining defects, so no more rows or columns need to be replaced. Thus, at the conclusion of the fourth column-by-column pass the column defect is decremented once more, causing it to underflow (i.e., it becomes negative) as shown in FIG. 6h. A similar result in the fourth row-by-row pass (not shown) causes the row defect threshold to also underflow. This satisfies the criterion for repairability of the memory, and the routine terminates with a "pass" result.

In a preferred embodiment, the present method employs both rowfast and columnfast marches, and uses a variety of test patterns. Alternate passes through memory perform column-wise, then row-wise evaluation, using one or more test patterns, which may vary. In this example the defect distribution remains static, but variation of the test pattern may cause the defect distribution to change from one pass to the next. Although the BIRA method is designed to be tolerant of such variations, in some cases a loss in efficiency may result. Following a successful test outcome, the addresses of rows and columns that need to be replaced can be scanned out of the memory, for use in performing a repair process, such as laser repair; notably, this takes far less time than scanning out a complete memory bitmap. Alternatively, if the memory device is capable of self-repair, redundant rows and columns can be swapped in automatically.

A flowchart in FIG. 1 illustrates a preferred embodiment of the BIRA method to accompany the following detailed discussion. Note that the flowchart contains a pair of similar loops, within which the entire memory is examined one column at a time, or one row at a time. Operations 14–20 and 24–30 are within loop 58 in FIG. 1, and apply to memory columns; therefore, loop 58 is executed once for each column in regular memory. Similarly, operations 36–42 and 50–56 within loop 60 apply to rows, and are repeated for every regular row. The column operations loop and row operations loop are both contained within outer loop 62, which repeats until the test yields a "fail" or "pass" result.

Five counters are initialized at the beginning of the routine in step 10. EC is an error counter, and records the number of defective cells in any given row or column; it is initially set to zero. CA and RA contain the number of available redundant columns and redundant rows, respectively. MEC and MER are the defect thresholds for columns and rows, respectively. They represent the maximum number of defects allowable in a given column/row before that column/row is flagged for replacement by a redundant column/row. Initially, MEC is set to RA and MER set to CA, and there is believed to be no benefit to setting MEC and/or MER to higher values. If, for example, a given column had more defective cells in it than there were redundant rows (i.e., EC>RA), it would be impossible to repair the column using only the redundant rows; therefore, it would have to be replaced by a redundant column.

In step 12 the column defect threshold MEC is compared to zero. If it is non-negative, the columns of regular memory are tested for defects using a rowfast march in step 14. This is a memory test in which a bit-pattern is written to the column and the contents read back one row at a time. For each defect found, EC is incremented—unless the defect is located in a row or column flagged for replacement, in which case it is ignored. In step 16, if the number of defects exceeds the current threshold (i.e., EC>MEC) and the redundant column counter has not underflowed (i.e., CA≧0), then the defective column is flagged for replacement and the number of available columns decremented in step 24. If there were no available redundant columns (CA=0) this action will cause an underflow in step 26. Since it may still be possible to repair the defects using redundant rows, RA is checked for underflow in step 30. If RA has underflowed, there is no hope of repairing the memory, and the fail exit is taken in step 32. Otherwise, the routine goes on to examine the next column in step 18. This step is also reached from step 16, in case the number of defects in the column was less than the threshold, or if the redundant column counter CA had already underflowed; this is tantamount to saying replacement by a redundant column is unnecessary or impossible. Returning to step 26, if CA does not underflow, then a redundant column is used to replace the defective column in step 28, after which the column address is incremented in step 18. Step 20 implements the loop counter for loop 58. When all of the columns of regular memory have been tested, the loop counter overflows and the routine leaves loop 58 and proceeds to step 22. In step 22 the column defect threshold MEC is decremented. The effect of this is that on each successive pass through loop 58, the criterion for replacement of regular memory columns becomes more stringent. That is, the number of allowable defects in a column before it is flagged for replacement becomes smaller. As a result, the worst columns are the first to be replaced.

The operations within loop 60 correspond to those within loop 58, except that they apply to rows (rather than columns) of regular memory. Steps 34–44 are analogous to steps 12–22, and steps 50–56 to steps 24–30. Loop 60 exits in step 44, after all of the rows have been tested, and proceeds to step 44. The row defect threshold MER is decremented and the routine proceeds to step 46, where both row and column defect thresholds are compared to zero. This comparison is the ultimate success criterion for the memory. As stated above, the row/column defect thresholds are decremented with every pass through the memory, thus applying a progressively stringent criterion for row/column replacement. Therefore, a "yes" branch out of step 46 to step 48 implies that the rows/columns have been successfully tested with a zero-defect criterion (i.e., MEC=, MER=≦0).

Although in this exemplary embodiment, MEC and MER are decremented by one, alternative embodiments are anticipated in which these counters may be reduced by some other value. For example, it may be advantageous to record the maximum number of defects in a row/column that does not qualify for replacement during a given pass, and then reduce MEC or MER to that value on the following pass. This could avoid "wasted" passes in which no rows/columns are flagged. For example, suppose one regular column has twelve defects, and none of the other columns has more than four defects. During the row-by-row pass in which MEC=12, the column with twelve defects will be flagged for replacement. If MEC is decremented by one at the end of each row-by-row pass, eight more passes will be required before MEC=4. During those eight passes, no more columns will be flagged for replacement, since the defect threshold is too high. If, during the pass with MEC=12, the highest number of defects in a column that did not qualify for replacement was also recorded, MEC could be reduced directly from 12 to 4. This would avoid the eight unnecessary passes, thereby accelerating the analysis.

If the memory device under test has built-in self-repair (BISR) capability, steps 28 and 54 in FIG. 1 can be performed during the redundancy analysis. Otherwise, the information needed to effect repair (i.e., the addresses of the rows and columns needing replacement) can be scanned out of the memory device for use by an external repair process, such as a laser memory repair system. In either case, once a row or column has been flagged for replacement, any errors detected in that row or column on subsequent passes through the memory are ignored.

The present BIRA method has been evaluated in a simulated comparison against a dedicated memory tester. As described earlier, the memory tester receives a bitmap representing the entire memory array (i.e. all rows and columns of regular memory) and indicating the locations of the defective memory cells. In addition, it is provided with the number of redundant rows and columns within the memory device, which can be used as replacements. Using a sophisticated mathematical algorithm, the tester allocates the redundant rows and columns so as to replace the greatest possible number of defective memory cells. If all of the defects can be replaced, the memory is deemed repairable. Clearly, every possible distribution of defects within a memory has a corresponding bitmap. Hence, it is possible to evaluate the BIRA method by comparing the number of these bitmaps for which it finds a repair solution to the number of solutions found by the memory tester. FIGS. 2a and 2b show the results of such a comparison.

In FIG. 2a the memory tester was provided with 30,000 bitmaps, each one representing a different distribution of defects. The table entries indicate the number of bitmaps for which the tester found a repair solution, and the rows and columns of the table represent the number of redundant rows and columns, respectively, in the hypothetical memory device. For example, the entry in the table of FIG. 2a corresponding to 3 redundant rows and 6 redundant columns indicates that 13,643 of the 30,000 bitmaps were repairable by the memory tester. The corresponding entry in FIG. 2b indicates that the BIRA routine did nearly as well, with 13,585 of the bitmaps repairable. This comparison demonstrates that the present BIRA method offers performance substantially equivalent to that of a stand-alone memory tester.

An embodiment of on-chip BIRA circuitry capable of implementing the present method is presented in FIG. 3. This block diagram also shows memory elements 64, which include regular and redundant elements, as well as the BIST circuitry 66 with which the BIRA circuitry is integrated. The circuit contains 5 counters, corresponding to the 5 counters in the flowchart: CA 68, RA 70, MEC 72, MER 74, and EC 76. In addition to these counters, a small number of simple logic elements are used to implement this embodiment of the BIRA method. It is believed that this circuitry can easily be incorporated into the BIST and interface logic already present in the memory device. The BIST circuitry 66 may use various march algorithms to test the memory, as described earlier. The Ptrn input 78 programs the bit pattern for the march, and the Mode input 80 selects either a rowfast or columnfast direction. Ign_col input 82 and Ign_row input 84 allow the BIST to ignore errors in columns or rows that have been flagged for replacement; as previously explained, errors are ignored in these columns or rows since they will presumably be repaired or exchanged for redundant memory elements.

At the start of circuit operation, the CA, RA, MEC, MER and EC counters are initialized as in the flowchart:

CA=no. of columns of redundant memory
RA=no. of rows of redundant memory
MEC=RA
MER=CA
EC=0

In addition, the Q output of the direction latch 86 is initialized to 0, setting the Mode 80 to a rowfast march through the columns, using a bit pattern determined by counter MER 74 and presented to Ptrn 78. This also programs the multiplexer 88 to select MEC 72 (the column defect threshold) and present it to comparator 90, and programs switch 92 to route the output of comparator 90 to Latch_Col signal line 94. The BIST circuitry 66 now runs through the first column row-by-row; each time it encounters a defective memory location Err output 96 clocks counter EC 76, incrementing the error count for that column. When BIST reaches the end of the column it strobes the Next output 98; this results in a comparison between EC 76 (the error count) and the column defect threshold. The result of this comparison appears on Latch_Col 94. If the number of defects in the column exceeds the column defect threshold a logic "1" state appears at the non-inverted input of gate 100. If the redundant columns have not all been used, CA counter 68 will not have underflowed, so the inverted input of gate 100 receives a logic "0". This results in a logic "1" output from gate 100, clocking CA counter 68 and decrementing the number of available redundant columns. The output of gate 100, delayed by inverters 102 and conditioned by gate 104, then clocks register Yreg 106. This latches the address of the column; subsequently, when this address is seen by the Ign_col input 82 of the BIST 66, it indicates that the column has been flagged for replacement, and any errors within it should be ignored. When Next output 98 returns to a Logic "0", the rising-edge transition from inverter 108 resets EC counter 76, preparing it to count the defects in the next column.

The operations described above continue until the last column has been tested, at which point the BIST 66 asserts the Done signal 110. At this point, the MEC counter 72 (containing the column defect threshold) is decremented. Note that gates 112 and 114 both receive the Q output of direction latch 86; but, depending on the state of this output, only one of the gates is enabled. Gate 112 thus ensures that at the end of a pass through the columns, Done signal 110 decrements MEC counter 72; similarly, at the end of a pass through the rows gate 114 ensures that Done signal 110 decrements MER counter 74. When Done returns to a Logic "0" it toggles direction latch 86. This causes the multiplexer 88 to present the output of MER counter 74 to the comparator 90, and also changes the state of switch 92 so that the comparator output is directed to redundant row logic, 116–122. The sequence of events that follows is analogous to those described in the previous paragraph, except that a columnfast march is used. The EC counter 76 accumulates an error count for each row, which is compared by comparator 90 against the row defect threshold in MER counter 74. A Logic "1" result (i.e., EC>MER) decrements the number of redundant rows in RA counter 70, and latches the address of the defective row in register Xreg 122. The addresses of flagged rows are presented to the Ign_row input 84 of the BIST 66, so that these rows will be ignored in subsequent testing.

The circuit in FIG. 3 continues the column/row analysis described above, progressively reducing the defect threshold counters MEC 72 and MER 74 until they underflow. At this point, both inputs of gate 132 receive a Logic "1", causing its output to go to Logic "0", which causes gate 134 to disable the Go input 136 of the BIST 66. This terminates the BIST testing of the memory. If the available redundant rows and columns were exhausted before all of the defects could be repaired, counters CA 68 and RA 70 will have underflowed, producing a Logic "1" at both inputs of gate 124, resulting in a Logic "1" at the "FAIL" output 126 and signifying that the memory is unrepairable. Otherwise, output 126 remains at Logic "0", while the "PASS" output 130 produces a Logic "1" (due to, e.g., Logic "1" inputs fed to gate 128), signifying that the memory is repairable.

It should be emphasized that the circuitry just described represents merely one possible implementation of the present BIRA method. In general, the method may be implemented as some form of execution device, such as a state machine, using circuitry internal to the memory device. Resources required for implementation of the BIRA routine are not significantly different or more extensive than would be needed for implementation of existing BIST routines, so its incorporation into memory devices is believed to be straightforward. Since the present BIRA routine does not require storage and analysis of the entire memory bitmap, it is inherently simpler than the algorithms typically employed by stand-alone memory testers. This, together with the fact that the routine is implemented in on-chip circuitry, may enable it to perform the redundancy analysis much faster than the offline tester.

A number of improvements and enhancements to the present BIRA method are contemplated. For instance, instead of a simple write—then—read march test of the memory locations, the routine could be readily modified to use a more complex test, such as read—then—write— then—read. Changes to the BIST algorithm would be required so that memory location addresses weren't incremented until all three operations were completed, and so the Error output would toggle only once per location even if more than one error was received for a given location.

Another improvement relates to the fact that, rather than being comprised of single-bit words, most memories are organized as multiple-bit data words. For example, if the data words contain N-bits, the memory is organized as N banks, with each bank split into individually addressable columns. This idea is illustrated in FIG. 4, for a 128×8×8-bit memory. The 128 memory rows 150 are addressable from R0 to R127, while the 8 memory columns 152 are addressable from C0 to C7. Note, however, that the column addresses are repeated in each of 8 banks 154, Bank0 through Bank7. Each of the banks corresponds to a memory input/output (I/O) line. That is, for each row/column address, 8 memory cells may be read or written. This is in contrast to the single-bit memory architecture previously considered, in which each row/column address corresponds to a single memory location. The present BIRA method is readily adaptable to multi-bit memories.

There are two approaches by which the method can be modified to perform redundancy analysis on a multi-bit memory, such as that illustrated in FIG. 4. The first is by sequentially testing each column in each bank, treating the memory as though it were configured as 128 rows×64 columns. A columnfast march through R3, for example, would test columns C0–C7 in Bank0, and then immediately proceed to column C0 in Bank1. The remaining columns in each of the banks in R3 would then be tested before proceeding to the next row. The total number of defects in a given row would be thus the sum of the defective cells in all 64 columns of that row. The advantage of this serial approach is simplicity, since it would require minimal additional circuitry and modification, compared to the single-bit method. Alternatively, a parallel approach is possible, which requires more extensive circuitry in the BIST, but yields faster performance. Each of Bank0–Bank7 would have its own comparator and error counter (90 and 76 in FIG. 3). In the parallel mode, a rowfast march through a column would perform a single test at each row, rather than 8 single-bit tests, as in the serial mode. Each test, however, would simultaneously test all 8 cells at a given row/column address. During rowfast marches (i.e., test each column row-by-row), separate error totals would be kept for each bank. During columnfast marches (i.e., test each row column-by-column) the sum of the errors in all 8 banks would be assigned to a given row. With either approach, the BIRA method is essentially the same as for the single-bit case.

Yet another improvement would allow for data retention testing. Following completion of the BIRA method described herein, a secondary test may be performed on the memory to locate weak or leaky memory cells, which fail to retain data for a prescribed interval following removal of the power supply voltage. A minimum of two passes through the memory would be required, in order to test locations with both Logic "1" and Logic "0".

The present BIRA method may be represented in the form of computer program instructions or a device description in a hardware description language, such as Verilog. These instructions or description may reside on a computer-usable carrier medium, as described earlier, from which the routine can be embodied in on-chip circuitry when the memory device is fabricated.

It will be appreciated by those skilled in the art having the benefit of this disclosure that this invention is believed to present a system and method for built-in redundancy analysis of a semiconductor memory. Further modifications and alternative embodiments of various aspects of the invention will be apparent to those skilled in the art in view of this description. Such details as the order of rowfast vs. columnfast passes as described herein are exemplary of a particular embodiment, and may be altered in other embodiments. It is intended that the following claims be interpreted to embrace all such modifications and changes and, accordingly, the specification and drawings are to be regarded in an illustrative rather than a restrictive sense.

What is claimed is:

1. A method for redundancy analysis of a semiconductor memory, wherein the memory comprises regular memory elements and redundant memory elements, and wherein the method uses an iterative sequence, comprising:
   (a) testing each of a set of regular memory elements for defects, and recording the number of defects found;
   (b) if the number of defects in one of the regular memory elements exceeds a defect threshold, recording an address of that element, removing the element from the set of elements being tested, reducing the defect threshold, and then reducing a number of available redundant memory elements;
   (c) if the number of defects in one of the regular memory elements does not exceed the defect threshold, reduce the defect threshold; and
   (d) reiterating (a), (b) and (c) until the defect threshold reaches a predetermined acceptable level.

2. The method as recited in claim 1, wherein the analysis yields a pass result if the defect threshold reaches the predetermined acceptable level and the number of available redundant memory elements is non-negative, and a fail result otherwise.

3. The method as recited in claim 2, wherein the predetermined acceptable level is zero.

4. The method as recited in claim 1, wherein the regular memory elements comprise columns of regular semiconductor memory, and the redundant memory elements comprise columns of redundant semiconductor memory.

5. The method as recited in claim 1, wherein the regular memory elements comprise rows of regular semiconductor memory, and the redundant memory elements comprise rows of redundant semiconductor memory.

6. The method as recited in claim 1, wherein testing comprises writing a test pattern to each memory element and comparing the pattern stored to the desired pattern.

7. The method as recited in claim 1, wherein, following a last iteration of the method, recorded addresses of regular memory elements whose defect count exceeded the defect threshold are available for use by memory repair means.

8. The method as recited in claim 1, wherein the memory elements further comprise multiple banks of memory locations, and wherein testing of the regular elements comprises testing each of the banks.

9. A system for redundancy analysis of a semiconductor memory, wherein the memory comprises regular memory elements and redundant memory elements, and the system comprises circuitry capable of:
   (a) comparing a number of defects in each of the regular elements against a defect threshold;
   (b) allocating a redundant element to replace each regular element in which the number of defects exceeds the threshold;
   (c) decrementing the threshold regardless of whether the number of defects exceeds the threshold; and (d) repeating (a), (b) and (c) until the threshold reaches a predetermined acceptable level or there are no non-allocated redundant elements.

10. The system as recited in claim 9, wherein the circuitry further comprises counters capable of representing a number of redundant elements, the number of defects in a regular element, and the defect threshold, such that said counters can be decremented or reset, and such that an underflow indication results when the number represented by a counter becomes negative.

11. The system as recited in claim 10, wherein the circuitry further comprises loop control circuitry operably coupled to the counters, and adapted to perform said decrementing the defect threshold and said repeating.

12. The system as recited in claim 11, wherein the loop control circuitry comprises an execution device capable of addressing regular memory elements, resetting the counters, and detecting an underflow condition in the counters.

13. The system as recited in claim 9, wherein the circuitry further comprises test circuitry, and wherein the test circuitry is capable of testing each of the regular memory elements, and counting the number of defects.

14. The system as recited in claim 9, wherein the circuitry further comprises comparison circuitry adapted to perform said comparing, and wherein if the number of defects in a regular memory element exceeds the defect threshold, the circuitry is adapted to record an address of the element, remove the clement from a set of elements to be tested, and reduce the number of non-allocated redundant elements.

15. The system as recited in claim 9, wherein the circuitry further comprises registers in which an address of a memory location may be stored, and wherein the circuitry is adapted to record in the registers addresses of regular memory elements for which the number of defects exceeds the defect threshold.

16. The system as recited in claim 15, wherein the registers are accessible by external memory repair means.

17. The system as recited in claim 15, wherein the registers are accessible by built-in self-repair circuitry within the memory device.

18. The system as recited in claim 9, further comprising circuitry to indicate a pass result if the defect threshold reaches the acceptable level and a number of non-allocated redundant memory elements is non-negative, and a fail result otherwise.

19. The system as recited in claim 9, wherein the circuitry comprises part of built-in self-test circuitry associated with the memory device.

20. The system as recited in claim 9, wherein the regular and redundant memory elements comprise multiple banks of memory locations, and wherein the test circuitry is adapted for testing each of the banks.

21. A computer-usable carrier medium, comprising program instructions defining operations performable by an execution unit for:
testing a set of elements within a regular portion of a memory associated with the execution unit, and counting defective locations within each element;
removing the elements in which a number of defective locations exceeds a defect threshold from the set of elements, and reducing a number of non-allocated redundant elements;
reducing the defect threshold, regardless of whether the number of defective locations exceeds the defect threshold, once all the elements in the set have been tested; and
re-testing the set of elements until the defect threshold reaches a predetermined acceptable level.

22. The computer-usable carrier medium as recited in claim 21, wherein said execution unit comprises a computational engine.

23. The computer-usable carrier medium as recited in claim 22, wherein said computational engine comprises a state-machine.

24. The computer-usable carrier medium as recited in claim 21, wherein said program instructions comprise a hardware description language.

25. The computer-usable carrier medium as recited in claim 21, wherein said program instructions are executable on a computer running a software simulator, such that all possible operations of the execution unit can be simulated.

26. A method for redundancy analysis of semiconductor memory, comprising:
testing regular memory column-by-column, with any regular column having greater than a column threshold number of errors being marked for replacement, if a replacement column is available, wherein errors within a row or column previously marked for replacement are ignored in determining the number of errors in a regular column, wherein as any regular column is marked for replacement, an available replacement column is designated as unavailable, and wherein after testing all regular memory columns, the column threshold is reduced regardless of whether the regular column has greater than the column threshold number of errors; and
testing regular memory row-by-row, with any regular row having greater than a row threshold number of errors being marked for replacement, if a replacement row is available, wherein errors within a row or column previously marked for replacement are ignored in determining tile number of errors in a regular row, wherein as any regular row is marked for replacement, an available replacement row is designated as unavailable, and wherein after testing all regular memory rows, the row threshold is reduced regardless of whether the regular row has greater than the row threshold number of errors.

27. The method as recited in claim 26, wherein the column-by-column and row-by-row testing are repeated until both the row and column thresholds become less than a predetermined acceptable level, or until there are no more available replacement rows or columns.

28. The method as recited in claim 26, wherein the column-by-column testing of the regular memory is performed subsequent to the row-by-row testing.

29. The method as recited in claim 26, further comprising substituting redundant rows or columns for regular memory rows or columns marked for replacement during testing, wherein said substituting comprises reassigning an address of a replaced regular memory row or column with a corresponding redundant row or column.

30. The method as recited in claim 26, wherein the column threshold is initially set to an initial number of available replacement rows, and the row threshold is initially set to an initial number of available replacement columns.

* * * * *